United States Patent [19]

Hayakawa et al.

[11] 4,300,153
[45] Nov. 10, 1981

[54] FLAT SHAPED SEMICONDUCTOR ENCAPSULATION

[75] Inventors: Masao Hayakawa, Kyoto; Takamichi Maeda, Yamatokoriyama; Masao Kumura, Nara, all of Japan

[73] Assignee: Sharp Kabushiki Kaisha, Osaka, Japan

[21] Appl. No.: 190,744

[22] Filed: Sep. 25, 1980

Related U.S. Application Data

[63] Continuation of Ser. No. 943,556, Sep. 18, 1978, abandoned.

[51] Int. Cl.³ .................. H01L 23/28; H01L 39/02; H01L 23/02
[52] U.S. Cl. ........................... 357/80; 357/72; 357/74; 357/73
[58] Field of Search ................. 357/72, 73, 74, 80

[56] References Cited

U.S. PATENT DOCUMENTS

| 3,192,307 | 6/1965 | Lazar | 357/74 |
|---|---|---|---|
| 3,206,647 | 9/1965 | Kahn | 357/72 |
| 3,325,586 | 6/1967 | Suddick | 357/72 |
| 3,388,301 | 6/1968 | James | 357/80 |
| 3,417,865 | 12/1968 | Suverkropp | 357/74 |
| 3,480,836 | 11/1969 | Aronstein | 357/74 |
| 3,484,534 | 12/1969 | Kilby et al. | 357/80 |
| 3,570,115 | 3/1971 | Barnes | 357/72 |
| 3,622,419 | 11/1971 | London | 357/72 |
| 3,745,648 | 7/1973 | Wiesner | 357/74 |
| 4,143,456 | 3/1979 | Inoue | 357/72 |

Primary Examiner—Andrew J. James
Attorney, Agent, or Firm—Birch, Stewart, Kolasch & Birch

[57] ABSTRACT

Electrodes are formed on one major surface of a semiconductor chip and electrically connected to lead electrodes carried by a support substrate. A cover plate is fixed to the opposing major surface of the semiconductor chip to determine one major surface of semiconductor device. Remaining surfaces of the semiconductor chip are encapsulated by a resin mold. The cover plate comprises a flexible glass cloth impregnated with half cured epoxy resin.

12 Claims, 10 Drawing Figures

FLAT SHAPED SEMICONDUCTOR ENCAPSULATION

This application is a continuation, of copending application Ser. No. 943,556, filed on Sept. 18, 1978 now abandoned.

BACKGROUND AND SUMMARY OF THE INVENTION

The present invention relates to a semiconductor device encapsulated by a resin mold and, more particularly, to a thin semiconductor device mounted on a flexible film carrier.

Recently, thin electronic wristwatches, thin electronic calculators and thin electronic cameras have been developed. These apparatuses require thin semiconductor devices disposed in these apparatuses. To fulfill the above requirements, a semiconductor device mounted on a flexible carrier film is developed.

Generally, the flexible carrier semiconductor device comprises a semiconductor chip and a flexible carrier film carrying wiring patterns formed thereon. Electrodes formed on the semiconductor chip are electrically connected to the wiring patterns formed on the flexible carrier film, and the semiconductor chip is encapsulated by a resin mold. The thickness of the film carrier semiconductor device is determined by the resin mold and, therefore, it is required to thin the resin mold.

Accordingly, an object of the present invention is to provide a thin semiconductor device.

Another object of the present invention is to provide a flat shaped semiconductor device encapsulated by a resin mold.

Still another object of the present invention is to provide a thin semiconductor device supported by a flexible film carrier.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, electrodes are formed on one major surface of a semiconductor chip. Lead electrodes are formed on a flexible carrier film and the electrodes on the semiconductor chip are electrically connected to the lead electrodes. A flat cover plate is disposed on the opposing major surface of the semiconductor chip in order to determine one major surface of a semiconductor device. A resin mold is formed in such a manner that the resin mold and the flat cover plate, in combination, encapsulate the semiconductor chip.

In a preferred form, the flat cover plate comprises a heat resistance fiber plate impregnated with half cured epoxy resin. The resin mold is formed through the use of a potting method.

BRIEF DESCRIPTION OF THE DRAWINGS

The present invention will become more fully understood from the detailed description given hereinbelow and the accompanying drawings, which are given by way of illustration only, and thus are not limitative of the present invention and wherein.

DESCRIPTION OF THE PREFERRED EMBODIMENTS

Figure 1:
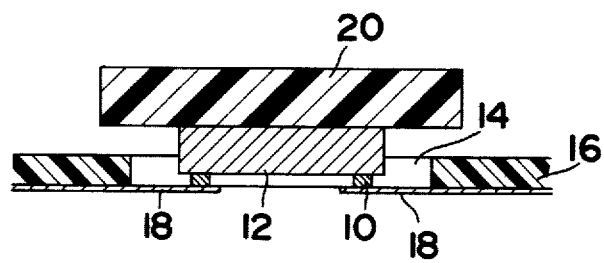
FIG. 1 is a sectional view of one step of formation of a semiconductor device of the prior art.

Referring now in detail to the drawings, and to facilitate a more complete understanding of the present invention, an example of a semiconductor device of the prior art mounted on a flexible film carrier will be first described with reference to FIGS. 1 and 2.

Electrodes 10 are formed on one major surface of a semiconductor chip 12, which is secured in an opening 14 formed in a flexible carrier film 16. Lead electrodes 18 and wiring patterns are formed on the flexible carrier film 16, and the electrodes 10 are electrically connected to the lead electrodes 18, which are extented to the opening 14.

A half cured resin pellet 20 is disposed on the opposing major surface of the semiconductor chip 12 as shown in FIG. 1. Then, the device is disposed in a furnace to melt the pellet 20. Thereafter, the device is turned over so that the major surface carrying the electrodes 10 faces upward. The major surface carrying the electrodes 10 is also covered by resin through the use of a half cured resin pellet or liquid resin. FIG. 2 shows a semiconductor device formed through the above-mentioned fabrication method.

Figure 2:
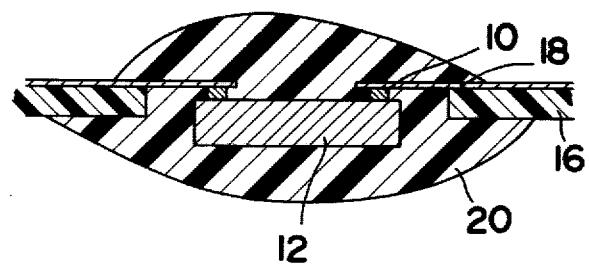
FIG. 2 is a sectional view of the semiconductor device of the prior art formed through the step of FIG. 1.

In the above constructed semiconductor device, the resin mold is expanded as shown in FIG. 2 due to the surface tension of resin. A typical semiconductor device of the prior art including a semiconductor chip of 4 mm square size has a thickness of about 2 mm. In addition, the semiconductor device of the FIG. 2 construction is not stable when disposed in an electronic apparatus because of its expanded portion.

To minimize the above-mentioned defects, a semiconductor device is proposed, wherein an indent or an opening is formed in the flexible carrier film in order to reduce the height of the expanded portion by absorbing extra resin therein. However, the indent or the opening formed in the flexible carrier film will preclude the enhancement of wiring density.

The present invention is to solve the above-mentioned problems. More specifically, the present invention is to provide a thin semiconductor device having a substantially flat resin mold.

The following embodiments include a flexible carrier film made of a polyimide film. However, the present invention is applicable to a semiconductor device including a metal lead frame, etc.

Figure 3A:
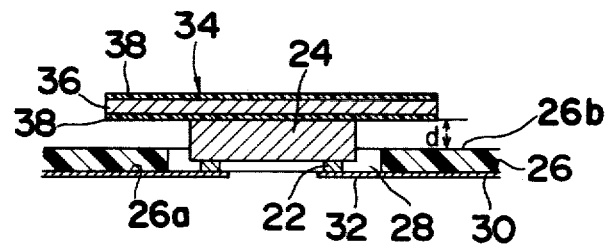
FIGS. 3(A) through 3(C) are sectional views of steps of formation of an embodiment of a semiconductor device of the present invention.
Figure 3B:
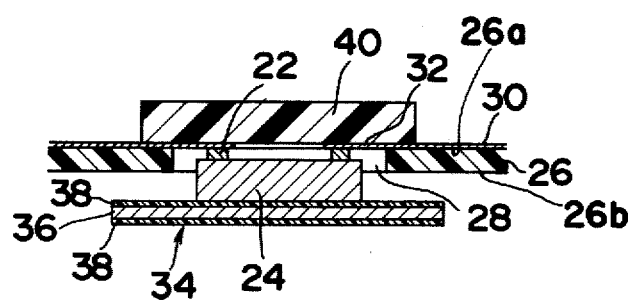
Figure 3C:
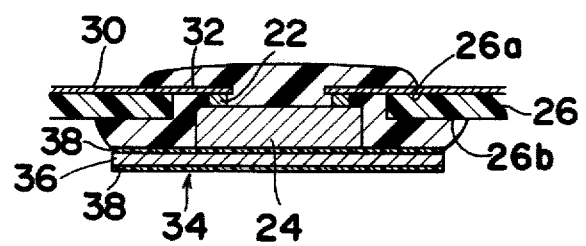

FIGS. 3(A) through 3(C) show fabrication steps of an embodiment of a semiconductor device of the present invention.

Electrodes 22 are formed on one major surface of a semiconductor chip 24 as is well known in the art. A flexible carrier film 26 made of a polyimide film is provided with an opening 28, and carries wiring patterns 30 and lead electrodes 32 formed thereon. The semiconductor chip 24 is disposed in the opening 28, and the electrodes 22 are electrically connected to the lead electrodes 32 as is well known in the art.

A cover plate 34 is disposed on the opposing major surface of the semiconductor chip 24 as shown in FIG. 3(A). The cover plate 34 has a size larger than that of the semiconductor chip 24, and comprises a flat plate 36 made of plastics, ceramics, aluminum, copper, etc. and a half cured epoxy resin layers 38 formed on the flat plate 36. The half cured epoxy resin layers 38 are not necessarily required on both sides of the flat plate 36, but the half cured epoxy resin layer 38 must be formed on the surface which contact the semiconductor chip 24. Under these conditions, the device is heated to melt the half cured epoxy resin layers 38, thereby fixing the semiconductor chip 24 to the cover plate 34.

Thereafter, the device is turned over, and a half cured resin pellet 40 is disposed on the major surface carrying the electrodes 22 as shown in FIG. 3(B). Alternatively, a liquid resin can be deposited on the semiconductor chip 24 through the use of a potting method.

The device is heated to melt the half cured resin pellet 40, whereby the semiconductor chip 24 is entirely covered by a resin mold 42 and the cover plate 34 as shown in FIG. 3(C). When the semiconductor chip 24 has a 4 mm square size, the thickness of the semiconductor device of the present invention is less than 1.5 mm.

Figure 4A:
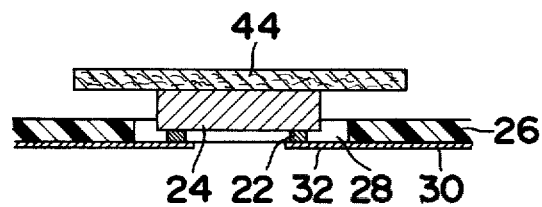
FIGS. 4(A) through 4(C) are sectional views of steps of formation of another embodiment of a semiconductor device of the present invention.
Figure 4B:
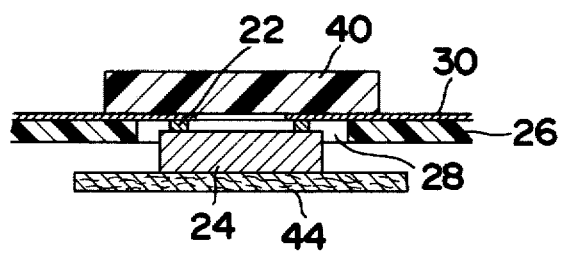
Figure 4C:
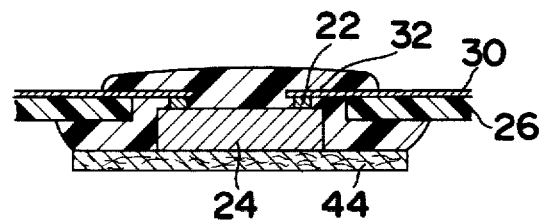

FIGS. 4(A) through 4(C) show fabrication steps of another embodiment of a semiconductor device of the present invention, wherein a fiber cloth plate is employed as a cover plate to facilitate escape of bubbles formed during the heating operation. Like elements corresponding to those of FIGS. 3(A) through 3(C) are indicated by like numerals.

A heat resistance fiber plate 44 has a size larger than that of the semiconductor chip 24. The heat resistance fiber plate 44 comprises a glass cloth plate or a metal cloth plate impregnated with half cured epoxy resin.

Figure 5:
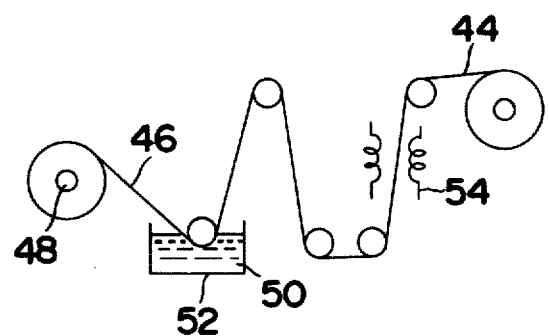
FIG. 5 is a schematic sectional view of a formation apparatus of a cover plate employed in the semiconductor device of FIGS. 4(A) through 4(C)

FIG. 5 schematically shows an example of an apparatus for impregnating the fiber plate with the half cured resin.

A web of a glass cloth 46 is wound around a roller 48. The glass cloth 46 is dipped in a liquid epoxy resin 50 contained in a reservoir 52. Thereafter, the glass cloth 46 impregnated with epoxy resin is heated by a heater 54, whereby the epoxy resin is half cured. The glass cloth 46 preferably has a thickness of 0.1 to 0.12 mm, and the fiber plate 44 impregnated with the half cured epoxy resin has a thickness of 0.15 to 0.20 mm.

The epoxy resin impregnated in the fiber plate 44 is melted while the device is heated under the condition where the fiber plate 44 is disposed on the semiconductor chip 24 as shown in FIG. 4(A), whereby the semiconductor chip 24 is fixed to the fiber plate 44 when the epoxy resin is cured. The bubbles formed during the heating operation escape through the glass cloth.

The semiconductor device of FIG. 4(C) is suited for mass production because not only the flexible carrier film 26 but also the heat resistance fiber plate 44 is flexible.

Figure 6:
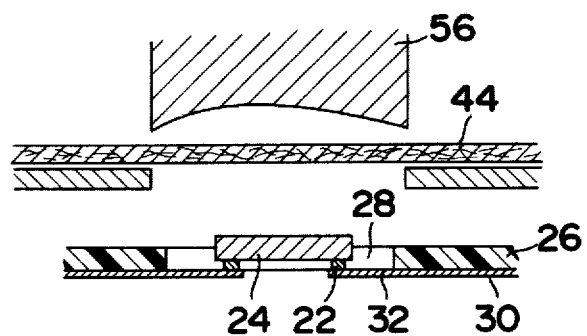
FIG. 6 is a sectional view of a cutting section of the cover plate formed by the apparatus of FIG. 5.

FIG. 6 shows a cutting section, where the fiber plate 44 is cut by a punching tool 56 in a desired configuration and disposed on the semiconductor chip 24.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor device comprising:

a semiconductor chip;

electrodes formed on one major surface of said semiconductor chip;

a flexible film support substrate provided with a through opening for securing said semiconductor chip therein;

lead electrodes carried by said support substrate and electrically connected to said electrodes formed on said one major surface of said semiconductor chip;

a cover plate, spaced from said support substrate and having a size larger than said semiconductor chip, fixed to the opposing major surface of said semiconductor chip; and a resin mold which contacts said semiconductor chip, said support substrate and said cover plate and which cooperates with said cover plate to substantially encapsulate said semiconductor device.

2. A semiconductor device comprising:

(a) a semiconductor chip;

(b) electrodes formed on one major surface of said semiconductor chip;

(c) a support substrate, having first and second major surfaces, provided with a through opening for securing said semiconductor chip therein;

(d) lead electrodes carried by said support substrate and electrically connected to said electrodes formed on said one major surface of said semiconductor chip;

(e) a cover plate, spaced from said support substrate and having a size larger than said semiconductor chip, fixed to the opposing major surface of said semiconductor chip; and (f) a resin mold for encapsulating said semiconductor chip in combination with said cover plate, whereby said resin mold contacts (1) said one major surface of said semiconductor chip;

(2) both major surfaces of said support substrate;

(3) said lead electrodes; and (4) at least a portion of the surface of said cover plate fixed to the semiconductor chip, thereby forming a connection between said semiconductor chip and said support substrate.

3. The semiconductor device of claim 1, wherein said lead electrodes extend from said support substrate into said opening formed in said support substrate.

4. The semiconductor device of claim 2, wherein said support substrate comprises a polyimide film.

5. The semiconductor device of claim 1, wherein said resin mold comprises an epoxy resin mold.

6. The semiconductor device of claims 1, 3, 4 or 5, wherein said cover plate comprises a heat resistance fiber plate impregnated with resin.

7. The semiconductor device of claim 6, wherein said heat resistance fiber plate comprises a flexible glass cloth.

8. The semiconductor device of claim 1, wherein said flexible film support substrate includes first and second major surfaces, respectively.

9. The semiconductor device of claims 1, 3, 4 or 5, wherein said cover plate comprises a flat plate of a material selected from the group consisting of plastics, ceramics, aluminum and copper.

10. The semiconductor device of claim 9, wherein the flat plate further includes an epoxy layer formed on the surface of the plate which contacts the semiconductor chip.

11. The semiconductor device of claims 1 or 2, wherein said cover plate is larger than said through opening.

12. The semiconductor device of claim 8, wherein said resin mold contacts both major surfaces of said support substrate.

* * * * *